(12) United States Patent
Bandoh et al.

(10) Patent No.: US 8,399,811 B2
(45) Date of Patent: Mar. 19, 2013

(54) STAGE FOR SUBSTRATE TEMPERATURE CONTROL APPARATUS

(75) Inventors: Kenichi Bandoh, Hiratsuka (JP); Katsuo Saio, Hiratsuka (JP); Kazuhiko Kubota, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 655 days.

(21) Appl. No.: 12/596,755

(22) PCT Filed: Mar. 28, 2008

(86) PCT No.: PCT/JP2008/056092
§ 371 (c)(1),
(2), (4) Date: Oct. 20, 2009

(87) PCT Pub. No.: WO2008/136228
PCT Pub. Date: Nov. 13, 2008

(65) Prior Publication Data
US 2010/0133256 A1    Jun. 3, 2010

(30) Foreign Application Priority Data
Apr. 26, 2007  (JP) .................................. 2007-116606

(51) Int. Cl.
*H05B 3/68* (2006.01)
(52) U.S. Cl. .................. 219/443.1; 219/444.1
(58) Field of Classification Search ............... 219/76.11, 219/121.15, 121.21, 121.31, 420, 429, 445.1, 219/446.1, 448.12
See application file for complete search history.

(56) References Cited

U.S. PATENT DOCUMENTS
2006/0102613 A1    5/2006  Kuibira et al.

FOREIGN PATENT DOCUMENTS
| JP | 9-134776 | 5/1997 |
| JP | 2006-93495 | 4/2006 |
| JP | 2006-140367 | 6/2006 |
| WO | 99/41778 | 8/1999 |

OTHER PUBLICATIONS
International Search Report issued Apr. 22, 2008 in International (PCT) Application No. PCT/JP2008/056092.

*Primary Examiner* — Cheung Lee
(74) *Attorney, Agent, or Firm* — Wenderoth, Lind & Ponack, L.L.P.

(57) ABSTRACT

A stage for a substrate temperature control apparatus having high reliability at low cost by preventing thermal deformation of a plate while employing a material other than ceramics as a material of the plate. The stage is used for mounting a substrate in the substrate temperature control apparatus for controlling a temperature of the substrate, and the stage includes: a plate having a first surface facing the substrate and a second surface opposite to the first surface; and a planar heater bonded to the second surface of the plate, wherein surface treatment is performed in a first thickness on the first surface of the plate, and the surface treatment is performed in a second thickness thinner than the first thickness or no surface treatment is performed on a predetermined area of the second surface of the plate.

13 Claims, 5 Drawing Sheets

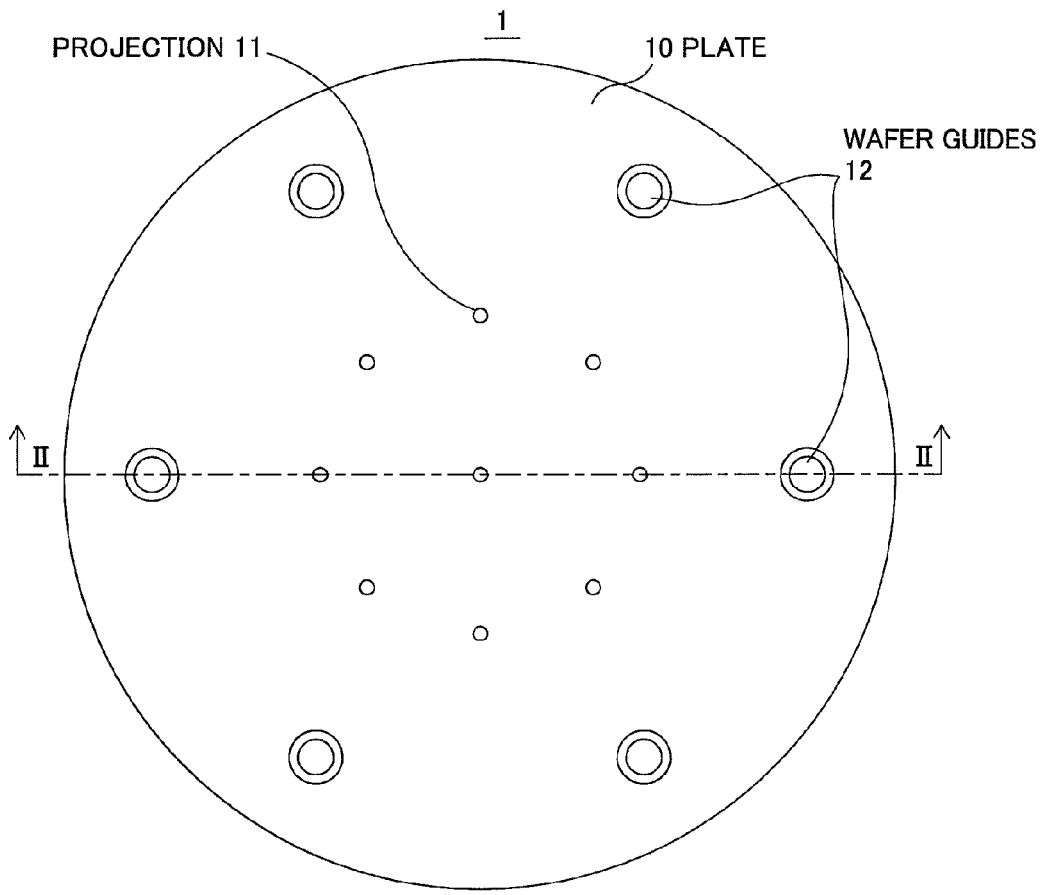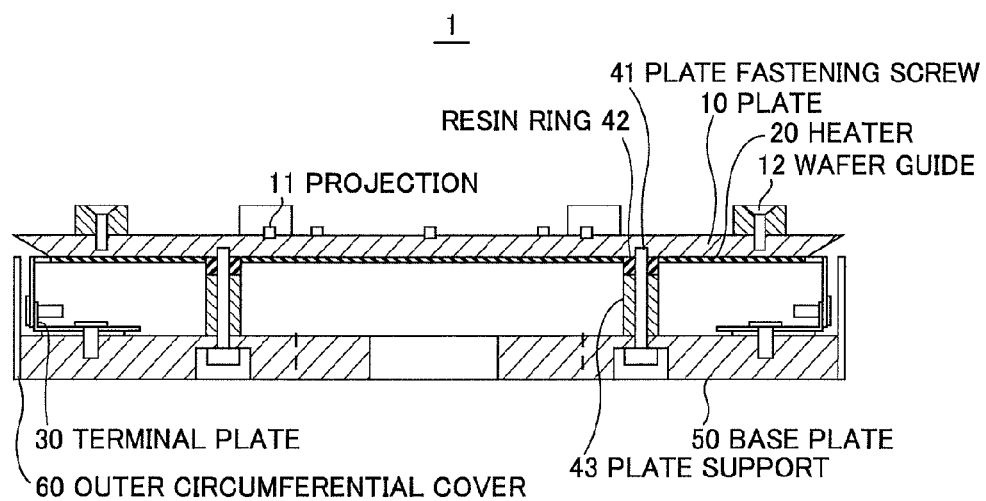

FIG.7

| | A5052 | SUS304 | POLYIMIDE | ALUMITE |
|---|---|---|---|---|
| YOUNG'S MODULUS (TENSION) (Pa) (ROOM TEMPERATURE) | $69.3 \times 10^9$ | $193 \times 10^9$ | $6.8 \times 10^9$ | $81 \times 10^9$ |
| COEFFICIENT OF LINEAR EXPANSION (/°C) (20°C ~ 100°C) | $23.8 \times 10^{-6}$ | $17.3 \times 10^{-6}$ | $21 \times 10^{-6}$ | $5 \times 10^{-6}$ |
| DENSITY (kg/m³) (20°C) | 2680 | 7930 | 1470 | 2750 |
| COEFFICIENT OF THERMAL CONDUCTIVITY (W/(m·K)) (20°C) | 137 | 16.3 | 0.29 | 85 |
| SPECIFIC HEAT (J/kg) (20°C) | 900 | 500 | 1130 | 837 |
| POISSON'S RATIO (ROOM TEMPERATURE) | 0.3 | 0.29 | 0.41 | 0.3 |

STAGE FOR SUBSTRATE TEMPERATURE CONTROL APPARATUS

TECHNICAL FIELD

The present invention relates to a stage to be used for mounting a substrate such as a semiconductor wafer, a liquid crystal panel, or the like in a substrate temperature control apparatus for controlling the temperature of the substrate during treatment of the substrate.

BACKGROUND ART

In recent years it has been increasingly important to precisely control the temperature of a substrate such as a semiconductor wafer, a liquid crystal panel, or the like in the treatment process of the substrate. For example, in a manufacturing process of semiconductor devices, heating and cooling of a wafer are frequently performed in such a manner that, after a resist is applied to the wafer, the wafer is heated for removal of a resist solvent, and then, the wafer is cooled. For this purpose, a substrate temperature control apparatus is used for appropriately controlling the temperature of the substrate.

The substrate temperature control apparatus includes a stage having a flat upper surface for mounting the substrate thereon, and a heating device or cooling device for heating or cooling the substrate is provided inside or in the lower part of the stage. Typically, an electrically heated wire, an infrared lamp, or a working fluid is used as the heating device, and a Peltier device or a working fluid is used as the cooling device.

As a related technology, International Publication WO99/41778 discloses an apparatus for controlling the temperature of a substrate such as a semiconductor wafer, a liquid crystal panel, or the like by heating or cooling the substrate in a treatment process of the substrate. In the apparatus for controlling the temperature of a substrate, a stage on which a semiconductor wafer is placed has a vertically symmetrical structure including a thin and flat type container of a metal having a high thermal conductivity, and film type heaters attached on upper and lower surfaces of the container. The vertically symmetrical structure is adapted to prevent the flexure of the stage due to the thermal expansion thereof and improve the soaking characteristics of the substrate.

Further, Japanese Patent Application Publication JP-A-9-134776 discloses a heating apparatus applied to baking treatment of a semiconductor or a liquid crystal panel and firing of a wafer and a substrate in a film formation process. The heating apparatus includes a base plate, a plate-like heating element provided on one surface of the base plate, and a face plate provided on one surface of the plate-like heating element, and the face plate is for heating a material to be heated on a surface of the face plate by using heat conduction from the plate-like heating element. The heating apparatus is characterized in that a heat conducting element having higher heat conductivity than that of the face plate is provided between the face plate and the plate-like heating element. Specifically, the face plate is made of an aluminum material and the surface of the face plate is alumite-treated. The heat conducting element is made of copper or a copper alloy.

Although the aluminum material is softer than ceramics, the aluminum material is inexpensive and has high heat conductivity. Therefore, if the face plate of the stage can be made by employing a thin aluminum material, a substrate temperature control apparatus at low cost and with high reliability can be realized. However, in the case where the stage has the vertically symmetric structure for preventing thermal deformation of the stage, the structure becomes complex.

DISCLOSURE OF THE INVENTION

Accordingly, in view of the above-mentioned points, an object of the present invention is to provide a stage for a substrate temperature control apparatus having high reliability at low cost by preventing thermal deformation of a plate while employing a material other than ceramics as a material of the plate.

In order to achieve the above-mentioned object, a stage for a substrate temperature control apparatus according to one aspect of the present invention is a stage to be used for mounting a substrate in the substrate temperature control apparatus for controlling a temperature of the substrate, and the stage includes: a plate having a first surface facing the substrate and a second surface opposite to the first surface; and a planar heater bonded to the second surface of the plate; wherein surface treatment is performed in a first thickness on the first surface of the plate, and the surface treatment is performed in a second thickness thinner than the first thickness on a predetermined area of the second surface of the plate or no surface treatment is performed on the predetermined area of the second surface of the plate.

According to the one aspect of the present invention, the surface treatment is performed in the first thickness on the first surface of the plate, and the surface treatment is performed in the second thickness thinner than the first thickness or no surface treatment is performed on the predetermined area of the second surface of the plate, and thereby, the stage for a substrate temperature control apparatus having high responsibility at low cost can be provided.

BRIEF DESCRIPTION OF THE DRAWINGS

FIG. 1 is a plan view showing a stage for a substrate temperature control apparatus according to one embodiment of the present invention;

FIG. 2 is a sectional view along alternate long and short dash line II-II as shown in FIG. 1;

FIG. 7 shows property values used in analyses of amounts of deformation of plates.

BEST MODE FOR CARRYING OUT THE INVENTION

Figure 3:
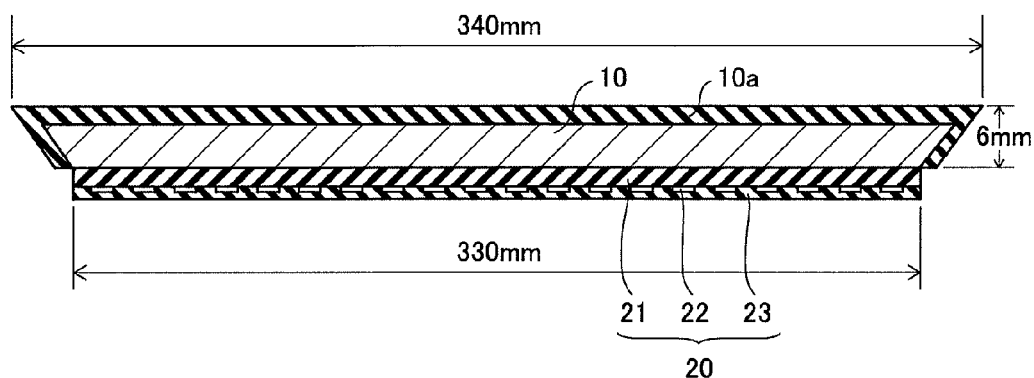
FIG. 3 is a sectional view schematically showing a plate and a heater of the stage for a substrate temperature control apparatus according to one embodiment of the present invention.

Hereinafter, embodiments of the present invention will be explained in detail by referring to the drawings. The same reference numerals are assigned to the same component elements and the description thereof will be omitted.

FIG. 1 is a plan view showing a stage for a substrate temperature control apparatus according to one embodiment of the present invention, and FIG. 2 is a sectional view along alternate long and short dash line II-II as shown in FIG. 1. A substrate temperature control apparatus is an apparatus for controlling a temperature of a substrate such as a semiconductor wafer, a liquid crystal panel, or the like in a treatment process of the substrate, and has a stage 1 to be used for mounting the substrate. As below, the case where a semiconductor wafer having a diameter of 300 mm is mounted on the stage 1 will be explained.

As shown in FIGS. 1 and 2, the stage 1 of the substrate temperature control apparatus includes a plate 10 having a disk shape, and plural projections 11 having heights of about 100 µm are provided on the plate 10. When a wafer is mounted on the stage 1, the projections 11 support the wafer and form a gap of about 100 µm between the wafer and the plate 10 in order to prevent the wafer from contacting with the plate 10. Thereby, the wafer is protected from contaminants attached to the plate 10. On the peripheral part of the plate 10, plural wafer guides 12 for preventing displacement of the wafer are provided to define the position of the wafer mounted on the stage 1.

Referring to FIG. 2, a circular sheet-like (planar) heater 20 for heating the wafer is attached to the plate 10, and a terminal plate 30 is provided for wiring the heater 20. The plate 10 and the heater 20 are fastened to a base plate 50 via a resin ring 42 and a plate support 43 with a plate fastening screw 41. By using the resin ring 42, heat is insulated between the plate 10 and the base plate 50, and the plate 10 becomes movable to some degree relative to the base plate 50 by sliding on the resin ring 42. An outer circumferential cover 60 is attached around the base plate 50. The stage 1 is accommodated in a case of the substrate temperature control apparatus.

FIG. 3 is a sectional view schematically showing a plate and a heater of the stage for a substrate temperature control apparatus according to one embodiment of the present invention.

The plate 10 is made of a thin aluminum material (A5052), and has a circular truncated cone shape with a longer diameter of 340 mm and a shorter diameter of 330 mm. To prevent thermal deformation, surface treatment (alumite treatment in the embodiment) is performed on the plate 10 except for the part, to which the heater 20 is bonded, to form an alumite layer 10a (i.e. surface treatment layer). In the embodiment, the alumite layer 10a having a thickness of 15 µm to 30 µm, desirably 20 µm is formed on the plate 10 having a thickness of 6 mm.

The heater 20 includes an insulating film 21 of polyimide, an electrically heated wire 22 of a thin film of a stainless steel material (SUS304) patterned on the insulating film 21, and an insulating film 23 of polyimide covering the electrically heated wire 22. Here, the thickness of the insulating film 21 is 50 µm, the thickness of the electrically heated wire 22 is 20 µm, and the thickness of the insulating film 23 is 25 µm in the thin part. The surfaces of the polyimide of the insulating films 21 and 23 are reformed to be bonded (thermal fusion bonded) to other members when heated to 300° C. or higher, and the plate 10 and the insulating film 21 and the insulating film 23 are hot-pressed and bonded to one another.

Since aluminum is relatively soft and has a larger coefficient of linear expansion than those of stainless steel and polyimide, if there is no alumite layer 10a, when the plate 10 is heated by the heater 20, deformation occurs in which the upper part of the plate 10 in the drawing becomes convex. The amount of deformation is as large as about 200 µm at 250° C. and exceeds the gap between the wafer and plate 10 (about 100 µm). For this problem, the alumite layer 10a having a predetermined thickness is formed on the upper surface of the plate 10, and thereby, the thermal expansion of the aluminum is suppressed to countervail the thermal expansion of the insulating film 21 of polyimide and the electrically heated wire 22 of the stainless thin film. As a result, the deformation of the plate 10 due to heating is reduced. Further, the heat deformation at manufacturing due to the difference in coefficient of linear expansion in the process of thermal fusion of the plate 10 and the insulating film 21 and the insulating film 23 by hot-pressing can be reduced with the above-mentioned structure.

Figure 4:
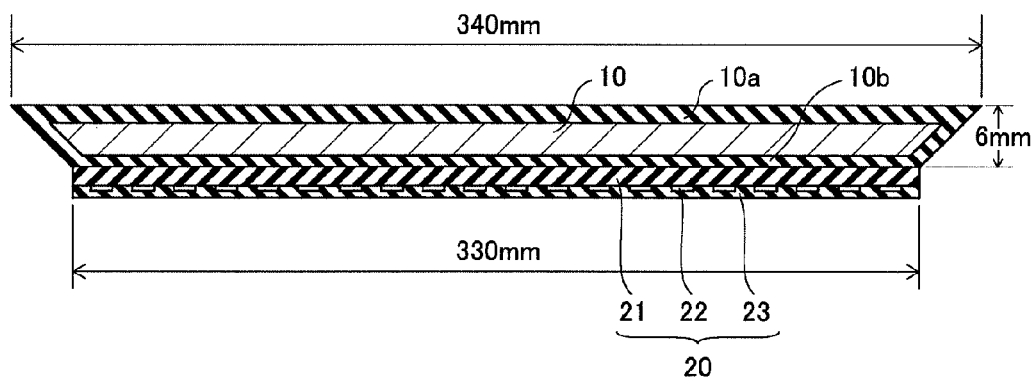
FIG. 4 is a sectional view schematically showing a plate and a heater of a stage for a substrate temperature control apparatus according to a modified example of one embodiment of the present invention.

FIG. 4 is a sectional view schematically showing a plate and a heater of a stage for a substrate temperature control apparatus according to a modified example of one embodiment of the present invention.

In this example, alumite layers 10a and 10b are formed by performing alumite treatment on the entire surface of the plate 10, and the thickness of the alumite layer 10b formed on the lower surface of the plate 10 is smaller than the thickness of the alumite layer 10a formed on the upper surface of the plate 10. That is, the alumite layer 10a on the upper surface of the plate 10 is formed thicker than the alumite layer 10b on the lower surface of the plate 10. In this case, the thickness of the plate 10 is also 6 mm, and the expansion of the upper part of the plate 10 is suppressed by forming the alumite layer 10a on the upper surface of the plate 10 thicker than the alumite layer 10b on the lower surface of the plate 10 by 15 µm to 30 µm, desirably 20 µm.

Next, results of amounts of deformation of plates due to temperature changes obtained by measurements and analyses will be explained.

Figure 5:
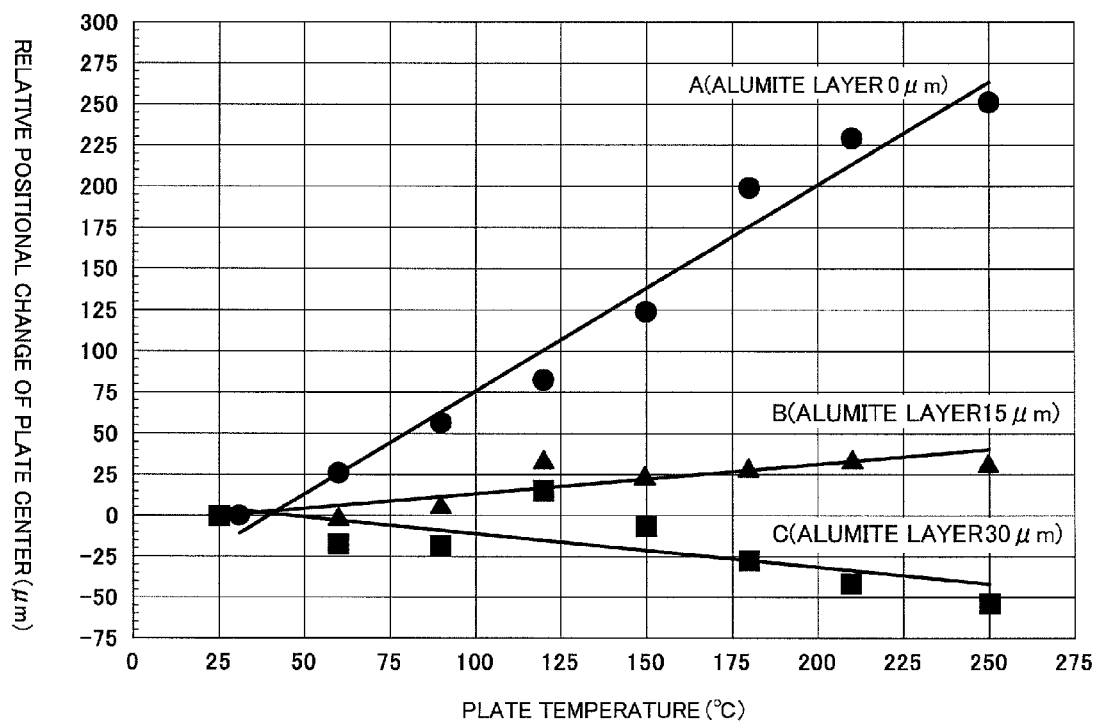
FIG. 5 shows measurement results of amounts of deformation of plates due to temperature changes.

FIG. 5 shows measurement results of amounts of deformation of plates due to temperature changes. In FIG. 5, the horizontal axis (x-axis) indicates the temperature (° C.) of the plate, and the vertical axis (y-axis) indicates the relative positional change (µm) of the plate center. In the case where the relative positional change of the plate center takes a positive value, deformation occurs in which the upper part of the plate 10 in FIG. 3 or FIG. 4 becomes convex, and, in the case where the relative positional change of the plate center takes a negative value, deformation occurs in which the upper part of the plate 10 in the drawing becomes concave.

The line "A" as shown in FIG. 5 linearly approximates the measurement result when no alumite layer 10a is formed on the upper surface of the plate 10 as shown in FIG. 3 (the alumite layer thickness is 0 µm). In FIG. 4, when the thickness of the alumite layer 10a formed on the upper surface of the plate 10 and the thickness of the alumite layer 10b formed on the lower surface of the plate 10 are equal to each other, a result near the approximation is obtained.

Further, the line "B" linearly approximates the measurement result when the alumite layer 10a having a thickness of 15 µm is formed on the upper surface of the plate 10 as shown in FIG. 3. In FIG. 4, when the alumite layer 10a formed on the upper surface of the plate 10 is thicker than the alumite layer 10b formed on the lower surface of the plate 10 by 15 µm, a result near the approximation is obtained.

Furthermore, the line "C" linearly approximates the measurement result when the alumite layer 10a having a thickness of 30 µm is formed on the upper surface of the plate 10 as shown in FIG. 3. In FIG. 4, when the alumite layer 10a formed on the upper surface of the plate 10 is thicker than the alumite layer 10b formed on the lower surface of the plate 10 by 30 µm, a result near the approximation is obtained.

Figure 6:
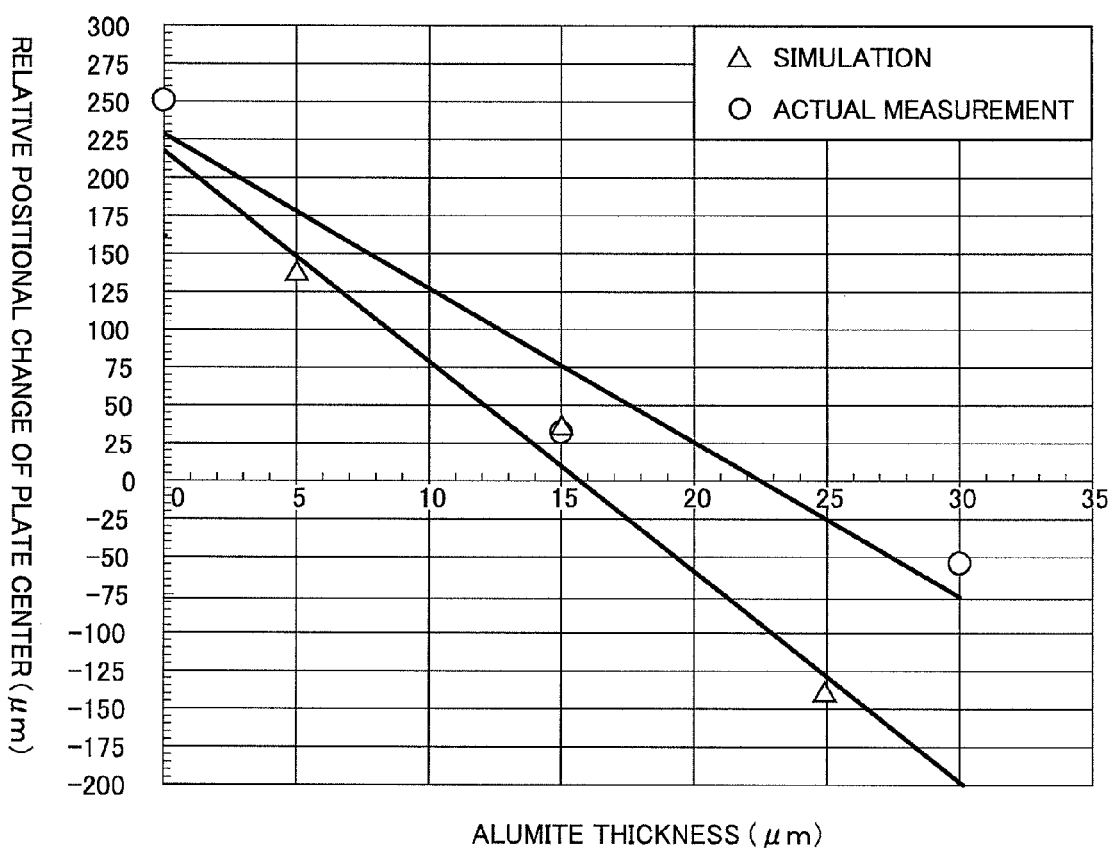
FIG. 6 shows an analysis result of amounts of deformation of plates at 250° C. in comparison with a measurement result.

FIG. 6 shows an analysis result of amounts of deformation of plates at 250° C. in comparison with a measurement result. In FIG. 6, the horizontal axis (x-axis) indicates the thickness (µm) of the alumite layer 10a formed on the upper surface of the plate 10 as shown in FIG. 3, and the vertical axis (y-axis)

indicates the relative positional change (μm) of the plate center. Here, triangular points represent values from a simulation, and circular points represent values from an actual measurement.

FIG. 7 shows property values used in analyses of amounts of deformation of plates. The amounts of deformation of plates due to temperature changes can be computed based on coefficients of linear expansion, Young's modulus, (Poisson's ratios), and thicknesses of the respective materials forming the plate and the heater. Analysis conditions are that no deformation occurs at the temperature of 23° C., the deformation due to temperature change is two-dimensionally axisymmetric, and the amounts are obtained in stationary states. Further, the stainless thin film as the electrically heated wire is uniformly formed to have a thickness of 20 μm.

As known from FIGS. 5 and 6, when the thickness of the alumite layer 10a formed on the upper surface of the plate 10 as shown in FIG. 3 is within a range from 15 μm to 30 μm, the amount of deformation of the plate 10 becomes especially small. In this case, the thickness of the plate 10 is 6 mm, and the thickness of the alumite layer 10a is equivalent to 0.25% to 0.5% of the thickness of the plate 10.

Further, a simulation has been executed under the condition that the plate 10 has a thickness of 4 mm, and it is similarly known that, when the thickness of the alumite layer 10a formed on the upper surface of the plate 10 as shown in FIG. 3 is within a range from 15 μm to 30 μm, the amount of deformation of the plate 10 becomes especially small. In this case, the thickness of the alumite layer 10a is equivalent to 0.375% to 0.75% of the thickness of the plate 10. Therefore, from the results, when the thickness of the alumite layer 10a is within a range from 0.25% to 0.75% of the thickness of the plate 10, an advantage that the amount of deformation of the plate 10 becomes especially small can be obtained. Specifically, when the thickness of the alumite layer 10a is near 20 μm, the amount of deformation of the plate 10 is closer to zero, and therefore, it is desirable that the thickness of the alumite layer 10a is within a range from 0.33% to 0.5% of the thickness of the plate 10.

Similarly, in FIG. 4, when the thickness of the alumite layer 10a formed on the upper surface of the plate 10 is made thicker than the alumite layer 10b on the lower surface of the plate 10 by 15 μm to 30 μm, the amount of deformation of the plate 10 becomes especially small. In the case where the thickness of the plate 10 is 6 mm, the thickness difference between the alumite layers is equivalent to 0.25% to 0.5% of the thickness of the plate 10. On the other hand, in the case where the thickness of the plate 10 is 4 mm, the thickness difference between the alumite layers is equivalent to 0.375% to 0.75% of the thickness of the plate 10. Therefore, from the results, when the thickness difference between the alumite layers is within a range from 0.25% to 0.75% of the thickness of the plate 10, an advantage that the amount of deformation of the plate 10 becomes especially small can be obtained. Specifically, when the thickness difference between the alumite layers is near 20 μm, the amount of deformation of the plate 10 is closer to zero, it is desirable that the thickness difference between the alumite layers is within a range from 0.33% to 0.5% of the thickness of the plate 10.

In the above described embodiment, the case where the alumite layer is formed by performing alumite treatment as surface treatment on the plate of aluminum as a base material has been explained. However, the present invention is not limited to that. For example, when employing silicon (Si) as a base material, a silicon oxide film ($SiO_2$) may be formed by performing oxidizing treatment as the surface treatment, or a silicon nitride film (SiN) may be formed by nitriding treatment as the surface treatment. In the case where a film or films is/are formed on one side or both sides of the base material, thermal deformation of the plate can be reduced by adjusting the thickness of the film or films. Alternatively, one side of the base material may be shot-blasted in a predetermined thickness, or, when both sides of the base material are shot-blasted, the treatment thickness may be changed with respect to each side. Further, plating such as gold plating may be performed on one side of the base material in a predetermined thickness, or, when plating is performed on both sides, the plating thickness may be changed with respect to each side.

INDUSTRIAL APPLICABILITY

The present invention is usable in a substrate temperature control apparatus for controlling the temperature of a substrate such as a semiconductor wafer, a liquid crystal panel, or the like at treatment of the substrate.

The invention claimed is:
1. A stage for a substrate temperature control apparatus, to be used for mounting a substrate in the substrate temperature control apparatus for controlling a temperature of the substrate, said stage comprising:
   a metal plate having a first surface facing the substrate and a second surface opposite to said first surface, a surface treatment layer being formed on said first surface of said metal plate by a surface treatment, said surface treatment layer having a predetermined thickness; and
   a planar heater including an electrically heated wire and insulating films, said electrically heated wire being held in between said insulating films,
   wherein said insulating films of said planar heater are made of polyimide, and said planar heater is fixed to said second surface of said metal plate by thermal fusion bonding.

2. The stage of claim 1, wherein said metal plate is made of aluminum, and said surface treatment layer is an alumite layer.

3. The stage of claim 2, wherein said surface treatment layer has a first thickness on said first surface of said metal plate,
   wherein a surface treatment layer having a second thickness is formed on said second surface of said metal plate, and
   wherein the second thickness is thinner than the first thickness, and a difference between said first thickness and said second thickness is within a range from 15 μm to 30 μm.

4. The stage of claim 2, wherein said surface treatment layer has a first thickness on said first surface of said metal plate, and said first thickness is within a range from 15 μm to 30 μm,
   wherein no surface treatment layer is formed on said second surface of said metal plate.

5. The stage of claim 2, wherein said surface treatment layer has a first thickness on said first surface of said metal plate,
   wherein a surface treatment layer having a second thickness is formed on said second surface of said metal plate, and
   wherein the second thickness is thinner than the first thickness, and a difference between said first thickness and said second thickness is within a range from 0.25% to 0.75% of a thickness of said metal plate.

6. The stage of claim 2, wherein said surface treatment layer has a first thickness on said first surface of said metal plate, and said first thickness is within a range from 0.25% to 0.75% of said thickness of said metal plate, wherein no surface treatment layer is formed on said second surface of said metal plate.

7. The stage of claim 2, wherein the insulating films include a first insulating film of polyimide and a second insulating film of polyimide covering said electrically heated wire, and wherein said electrically heated wire is a stainless thin film patterned on said first insulating film.

8. The stage of claim 7, wherein said surface treatment layer has a first thickness on said first surface of said metal plate, wherein a surface treatment layer having a second thickness is formed on said second surface of said metal plate, and wherein the second thickness is thinner than the first thickness, and a difference between said first thickness and said second thickness is within a range from 15 µm to 30 µm.

9. The stage of claim 7, wherein said surface treatment layer has a first thickness on said first surface of said metal plate, and said first thickness is within a range from 15 µm to 30 µm, wherein no surface treatment layer is formed on said second surface of said metal plate.

10. The stage of claim 7, wherein said surface treatment layer has a first thickness on said first surface of said metal plate, wherein a surface treatment layer having a second thickness is formed on said second surface of said metal plate, and wherein the second thickness is thinner than the first thickness, and a difference between said first thickness and said second thickness is within a range from 0.25% to 0.75% of a thickness of said metal plate.

11. The stage of claim 7, wherein said surface treatment layer has a first thickness on said first surface of said metal plate, and said first thickness is within a range from 0.25% to 0.75% of said thickness of said metal plate, wherein no surface treatment layer is formed on said second surface of said metal plate.

12. The stage of claim 1, wherein said surface treatment is performed in a first thickness on said first surface and said surface treatment is performed in a second thickness thinner than said first thickness on said second surface of said metal plate.

13. A substrate temperature control apparatus comprising:
 the stage of claim 1;
 a base plate; and
 a resin ring disposed between said stage and said base plate.

* * * * *